United States Patent [19]
Arbab et al.

[11] Patent Number: 6,010,602
[45] Date of Patent: Jan. 4, 2000

[54] ANNEALED LOW EMISSIVITY COATING

[75] Inventors: Mehran Arbab; James J. Finley, both of Pittsburgh; Larry A. Miller, Sarver, all of Pa.

[73] Assignee: PPG Industries Ohio, Inc., Cleveland, Ohio

[21] Appl. No.: 08/854,591

[22] Filed: May 12, 1997

Related U.S. Application Data

[63] Continuation of application No. 08/585,378, Jan. 11, 1996, abandoned, which is a continuation of application No. 08/363,805, Dec. 27, 1994, abandoned.

[51] Int. Cl.[7] .............................. C23C 14/34; C03C 17/36
[52] U.S. Cl. ................................ 204/192.27; 204/192.26; 65/60.2
[58] Field of Search .................... 204/192.26, 192.27, 204/192.28, 192.29, 192.15; 427/165, 166; 65/60.2, 60.4, 60.5

[56] References Cited

U.S. PATENT DOCUMENTS

| | | | |
|---|---|---|---|
| 2,825,687 | 3/1958 | Preston | 204/192.29 |
| 3,655,545 | 4/1972 | Gillery et al. | 204/192.29 |
| 4,094,763 | 6/1978 | Gillery et al. | 204/192.29 |
| 4,447,473 | 5/1984 | Mashida et al. | 427/162 |
| 4,610,771 | 9/1986 | Gillery | 204/192.1 |
| 4,749,397 | 6/1988 | Chesworth et al. | 65/60.2 |
| 4,834,857 | 5/1989 | Gillery | 204/192.27 |
| 4,898,789 | 2/1990 | Finley | 428/623 |
| 4,898,790 | 2/1990 | Finley | 428/623 |
| 4,902,580 | 2/1990 | Gillery | 428/623 |
| 5,059,295 | 10/1991 | Finley | 204/192.27 |
| 5,294,238 | 3/1994 | Fukada et al. | 65/60.2 |

FOREIGN PATENT DOCUMENTS

| | | |
|---|---|---|
| 0 546 470 | 6/1993 | European Pat. Off. . |
| 59-117273 | 7/1984 | Japan ............ 204/192.29 |

OTHER PUBLICATIONS

Angadi, M. A. et al., "Heat Mirrors Using $CeO_2/Cu/CeO_2$ Multilayer Films", *Journal of Materials Science Letters*, (1989) vol. 8, No. 4, pp. 391–394.

*Primary Examiner*—Nam Nguyen
*Assistant Examiner*—Rodney G. McDonald
*Attorney, Agent, or Firm*—Donald C. Lepiane

[57] ABSTRACT

A low emissivity coated article comprising a glass substrate and a coating comprising a layer of infrared reflective metal between layers of antireflective metal oxide is heated to a temperature below the strain point of the substrate for a sufficient time to anneal the coating without affecting the substrate to improve the chemical and mechanical durability of the coating.

16 Claims, 2 Drawing Sheets

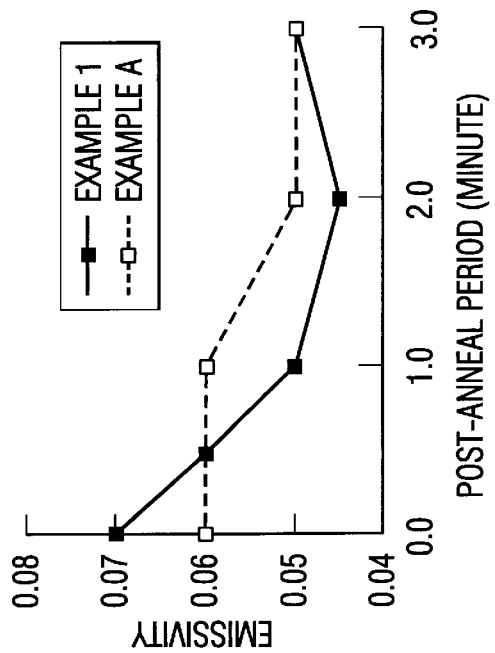
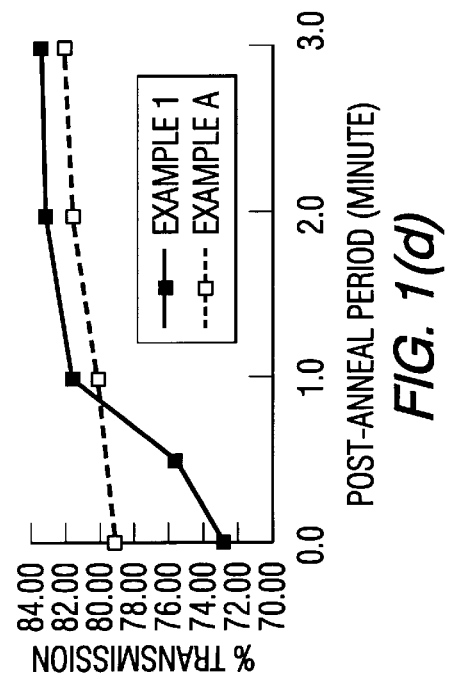
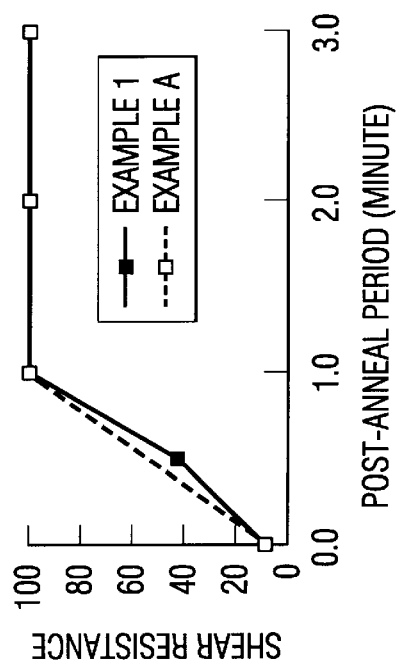

ANNEALED LOW EMISSIVITY COATING

This application is a continuation of application Ser. No. 08/585,378, filed Jan. 11, 1996, now abandoned which is a continuation of application Ser. No. 08/363,805, filed Dec. 27, 1994, now abandoned.

FIELD OF THE INVENTION

The present invention relates generally to the art of multiple layer low emissivity coatings, and more particularly to the art of low emissivity coatings of the general configuration metal oxide/silver/metal oxide.

BACKGROUND OF THE INVENTION

U.S. Pat. No. 4,610,771 to Gillery discloses multiple layer high transmittance, low emissivity coatings comprising zinc-tin oxide/silver/zinc-tin oxide deposited by cathode sputtering.

U.S. Pat. Nos. 4,834,857 and 4,902,580 to Gillery disclose an improved neutral high transmittance, low emissivity coating comprising an infrared reflective metal layer between antireflective metal oxide layers wherein a high refractive index neutral metal oxide layer is deposited between the antireflective metal oxide and the infrared reflective metal layer.

U.S. Pat. No. 4,898,789 to Finley discloses a low emissivity film for automotive heat load reduction comprising a first antireflective metal oxide layer, a first infrared reflective layer, a first primer layer, a second antireflective metal oxide layer, a second infrared reflective metal layer, a second primer layer and a third antireflective metal oxide layer.

U.S. Pat. No. 4,898,790 to Finley discloses a low emissivity film of the metal oxide/silver/metal oxide type for high temperature processing such as bending, tempering, or laminating, wherein a primer layer between the infrared reflective metal layer and the antireflective metal oxide layer comprises a layer of metal and a layer of metal oxide.

U.S. Pat. No. 5,059,295 to Finley discloses a method of making a low emissivity coating comprising sputtering a first layer of zinc-tin oxide, sputtering a second layer of titanium, sputtering a third layer of silver, sputtering a fourth layer of titanium, sputtering a fifth layer of zinc-tin oxide, sputtering a sixth layer of titanium oxide and then heating the glass at a temperature where the titanium layers will oxidize but protect the silver from oxidizing.

SUMMARY OF THE INVENTION

The present invention provides an improvement in sputtered multiple layer, low emissivity coatings by thermal processing of the coated substrate at temperatures below the strain point of the substrate, e.g. soda-lime-silica glass. The present invention maximizes the chemical and mechanical durability and optimizes the optical and solar energy properties of sputtered low emissivity films comprising one or more infrared reflective metal films between two or more antireflective metal oxide films. Thermal processing at temperatures below the strain point of glass is sufficient to anneal the infrared reflective metal, e.g. silver, and the metal oxide layers to optimize the chemical and mechanical durability of the coating.

BRIEF DESCRIPTION OF THE DRAWING

FIG. 1 illustrates the effect of annealing on the properties of two coated articles in accordance with the present invention. These coated articles were placed in a loft furnace at 1000° F. (about 538° C.) for the periods of time indicated.

FIG. 1a shows the effect of annealing on the sheet resistance of the coated article, measured in ohms per square, as a function of annealing period.

FIG. 1b shows the effect of annealing on the emissivity of the coated article.

FIG. 1c illustrates the effect of annealing on the shear resistance, evaluated as described in the specification.

FIG. 1d illustrates the effect of annealing on the light transmission of the coated article.

FIG. 2 illustrates the effects of annealing on the properties of a double silver layer coated article in accordance with the present invention. These coated articles were placed in a loft furnace at 850° F. (454° C.) for the periods of time indicated.

DESCRIPTION OF PREFERRED EMBODIMENTS

Figure 2A:
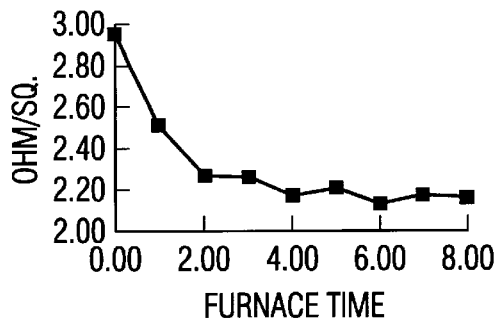
FIG. 2a shows the effect of annealing on the sheet resistance of the coated article, measured in ohms per square.
Figure 2B:
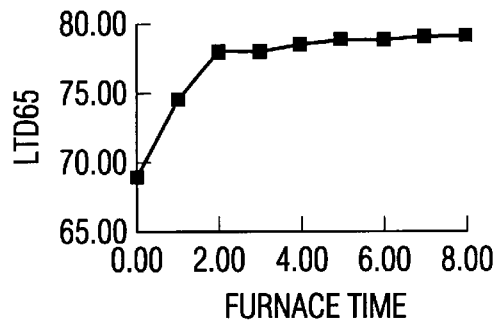
FIG. 2b shows the effect of annealing on the light transmittance.
Figure 2C:
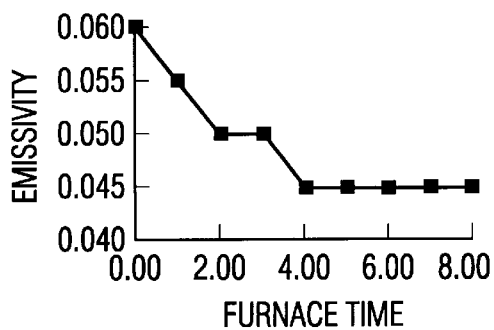
FIG. 2c shows the effect of annealing on the emissivity.
Figure 2D:
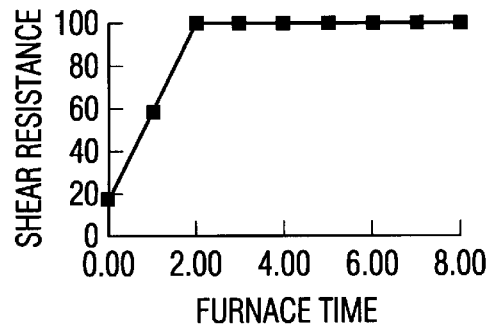
FIG. 2d shows the effect of annealing on the shear resistance of the coating.

A low emissivity multilayer thin film stack consisting of the general layer sequence of metal oxide/silver/metal primer/metal oxide/silver/metal primer/metal oxide/ protective overcoat is preferably deposited by magnetron sputtering as has been disclosed previously.

The present invention provides a new process to maximize the performance and the chemical and mechanical durability of such low emissivity coated glass substrates. The optical, mechanical and chemical properties of a coating based on the above layer sequence can be significantly improved if the coated substrate is heated to moderate to high temperatures for a short period of time to anneal the coating. Annealing results from thermal processing of the coating after its deposition, resulting in the elimination or reduction of mechanical and chemical stresses within the layers of the coating or at the interfaces. These stresses, which result in a less durable coating, as well as a coating with higher resistance and emissivity, may result from structural defects, such as point defects and grain boundaries within the silver layer, or the presence of more reactive metals layers, e.g. titanium, next to oxide of other metals, e.g. zinc and tin.

By heating to eliminate or reduce structural defects and chemical reactions, annealing results in mechanically and chemically more stable layers and interfaces. In order to avoid the introduction of permanent stresses in the glass substrate, the maximum temperature used for this purpose should remain below the strain point temperature of the glass substrate, e.g., 940° F. (504° C.) for a clear soda-lime silica glass. The preferred temperature range for this application is between about 600° F. (315° C.) and the strain point of the substrate, more preferably about 700 to 850° F. (about 371 to 454° C.). Heating to anneal the coating may be accomplished by any means such as convective, conductive, radiative, inductive or combinations thereof. Various apparatus such as an annealing lehr, furnace or oven may be employed. Alternatively, the coating may be annealed by heating the coated article while it is still in the coating chamber, preferably either by inductive or radiative means.

Annealing may even be performed after deposition of the metal layer or layers prior to deposition of the final oxide layer or layers. Preferably, the coated article may be heated in a low partial pressure of oxygen.

In order to prevent the breakdown of silver through agglomeration resulting from exposure to the oxygen plasma during sputter deposition of the metal oxide layers, or agglomeration during the post-heating process, the thickness range of the primer layers, which are preferably deposited as metals, is preferably between 10 and 25 Angstroms, with a more preferred range of 15 to 20 Angstroms. In the preferred coating design, the above reaction barrier layer consists of a reactive metal such as titanium for high transmission applications, e.g., 75 percent or higher visible transmittance, or less reactive metals for lower visible transmittance applications, or a combination thereof.

Heating of the film, preferably using convective heat transfer as in a furnace or oven, or both convection and radiation of the glass substrate as in an annealing lehr, results in the partial oxidation of the primer layer, annealing of defects in the silver layer, which contribute to scattering of electrons and light, as well as the growth of silver grains. All of these effects result in an increase in the visible transmission of the coated article, as well as a measurable reduction in its sheet resistance and emissivity. The extent of variations of the above chemical and physical properties may be controlled through a combination of the maximum temperature and the duration of anneal, as well as the design of the film, e.g. the alteration of the primer layer thicknesses. These variations result in control of the final transmission, the emissivity and the shading coefficient of the coated article. While it is possible to provide a coating with adequate mechanical durability without annealing, the annealing process of the present invention provides a broad process window and a significant improvement in chemical durability of the coating.

In the following examples, an amorphous zinc stannate layer is used as the metal oxide dielectric layer. The examples illustrate the effect of maximum sample temperature, as well as anneal time, on the observed properties. The maximum temperature of the furnace, oven or lehr may be higher than the desired maximum temperature of the substrate to minimize the time necessary to anneal the coating. Depending on the apparatus and the method of heating, a broad range of times and temperatures may be employed to produce annealed coatings in accordance with the present invention, which will be further understood from the descriptions of specific examples which follow.

EXAMPLE 1

A low emissivity coating comprising eight separately deposited contiguous layers was produced in an Airco ILS1600 dc magnetron sputter deposition system with a base pressure of not more than $5 \times 10^{-6}$ Torr. All layers were deposited at 4 millitorr of total working gas pressure. The process consisted of multiple and sequential passes of a 12×12×0.09 inch (30.5×30.5×0.23 centimeter) plate of a clear soda lime float glass at a line speed of 120 inches (3.05 meters) per minute under the active cathode sputter targets. All metal layers were deposited in pure argon; the zinc stannate layers and the titanium oxide overcoat were deposited in 65 percent oxygen-35 percent argon and 50 percent oxygen-50 percent argon gas mixtures, respectively.

The coating consisted of a first anti-reflective layer of zinc stannate deposited at 4.7 amps and 1.8 kilowatts (kw) in 4 passes; a first infrared reflective silver layer deposited at 1.10 amps and 0.4 kw in one pass; a first titanium metal primer layer deposited at 1.60 amps and 0.55 kw in one pass; a second anti-reflective layer of zinc stannate deposited at 4.7 amps and 1.8 kw in 10 passes; a second infrared reflective silver layer deposited at 1.6 amps and 0.6 kw in one pass; a second titanium metal primer layer deposited at 1.64 amps and 0.55 kw in one pass; a third anti-reflective layer of zinc stannate deposited at 4.62 amps and 1.8 kw in 4 passes; and finally, a titanium oxide protective layer deposited at 12.46 amps and 6.0 kw in 3 passes. The coated glass plate was cut into multiple 2×12 inch (5×30.5 centimeter) sections parallel to its leading edge. The cut sections were then heated in a 1000° F. (about 538° C.) loft furnace for various time intervals.

Figure 2E:
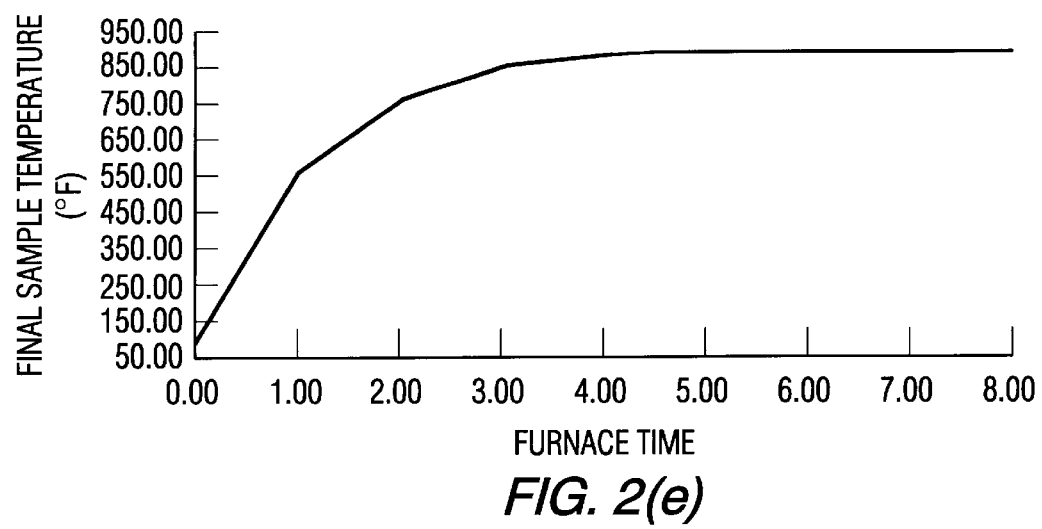
FIG. 2e illustrates the sample temperature as a function of time in the furnace.

Properties of the annealed coated glass of this example are shown in FIG. 1. Sheet resistance, emissivity and visible light transmittance were measured using conventional measurement methods. Another measured property relates to the shear resistance of the coating, which is an important characteristic of low emissivity coatings. Shear resistance determines the mechanical durability of the coating which is critical during the transport of coated glass. The method used herein for the evaluation of shear resistance consists of applying 20 successive strokes of a cloth wet with deionized water against the coated surface of glass, followed by visual examination of the tested area. If a coating shows no signs of shear, including barely visible scratches, then it receives a maximum rating. Coatings that display uniform shear and delamination at any interface of the multi-layer coating within the test area receive a failing rating. Other levels of performance receive intermediate scores. In FIG. 1c, subjective numerical grades are reported for resistance to shear. This method of coating durability characterization has been found to correlate well with the field performance of the coating. Clearly all measured properties of the coating improve with residence time of the sample in the loft furnace. For all anneal periods shown in FIG. 1, the sample temperature remains below that of the furnace and within the transient of the time-temperature curve shown in FIG. 2e.

COMPARATIVE EXAMPLE A

A low emissivity coating comprising 10 layers is prepared as in Example 1 except that a very thin layer of titanium oxide was deposited above the first and second titanium metal primer layers. These layers, each approximately 9 Angstroms thick, were deposited in a 65 percent oxygen-35 percent argon gas mixture at 6.4 amps and 3 kw in one pass. The relatively low sputtering power level for titanium oxide was selected in order to allow only a slow coverage of the outer metal primer layer and, consequently, to facilitate its effective oxidation by the intense oxidizing plasma that contacted it. The desired conversion of most of the latter metal layer to oxide was confirmed by in situ measurement of coating transmission immediately before and after the deposition of the above titanium oxide layers, which showed a large increase after the oxidation step. As a result of the above conversion, the as-deposited sample shows an appreciable improvement in transmission, sheet resistance and emissivity over the unheated coated glass of Example 1, i.e. before annealing. However, until further heat treatment, its resistance to shear remains very low, comparable to that of the unheated coated glass of the previous example, i.e. before annealing. These examples illustrate the critical role of post-anneal in affording the coating its superior qualities. The oxidation of the titanium primer layers, e.g. by plasma oxidation, is insufficient for maximizing the durability and performance of the coating without the annealing process of the present invention.

EXAMPLE 2

An eight layer coating such as that described in Example 1 was deposited on 69×41×0.09 inch (175×104×0.23 centimeter) clear float glass plates in a seven zone 84 inch (213 centimeter) Airco in-line coater. The coating consisted of a first anti-reflective layer of zinc stannate deposited at 280 Angstroms; a first infrared reflective silver layer deposited at 113 Angstroms; a first titanium metal primer layer deposited at 24 Angstroms; a second anti-reflective layer of zinc stannate deposited at 750 Angstroms; a second infrared reflective silver layer deposited at 150 Angstroms; a second titanium metal primer layer deposited at 24 Angstroms; a third anti-reflective layer of zinc stannate deposited at 240 Angstroms; and finally, a titanium oxide protective layer deposited at 48 Angstroms. The full size coated glass plates were then post-heated in an in-line Cattin lehr to approximately 800 to 900° F. (about 427 to 482° C.). A number of the heated plates, corresponding to a typical skid size, were then packed on a steel rack and shipped more than 1200 miles between the production and inspection sites. All plates were free of the defects typical of less mechanically durable coatings, where shear marks and scratches are incurred due to contact with the interleaving material and the relative shift of the adjacent glass plates. Furthermore, for more than eight months of storage, from winter through fall, plates of this group of samples remained free of environmentally induced defects (e.g., isolated "summer spots" that are frequently observed due to exposure to warm and humid weather) without the aid of any additional protection other than a loose plastic cover. Sheet resistance, transmittance, emissivity, and shear resistance are measured as in Example 1. Properties of the annealed coated glass of this example are shown in FIG. 2.

Two full-size coated plates, one heated and the other without any heat treatment, were measured for residual stresses (i.e., surface compression and center tension) in the glass. Both samples showed anneal levels well within the acceptable limits with no significant differences between the two plates. Thus, the annealing of the coating did not impair the glass substrate.

EXAMPLE 3

Sections of the coated glass plates from Example 2 were cut prior to heating in the lehr and were instead heat treated in a loft furnace that was pre-heated to 850° F. (about 454° C.). Different anneal times were used in order to determine the optimum heat schedule at a maximum furnace temperature of 850° F. (about 454° C.). An examination of the property versus anneal time curves suggests a range of 2 to 6 minutes, with a preferred range of 3 to 5 minutes, and most preferably 4 minutes of anneal. Excessive anneal periods at this or higher furnace temperatures can result in the deterioration of the coating, and are not preferred. Lower furnace temperatures, e.g. 700° F. (about 371° C.), may be used but are less desirable since longer anneal periods are necessary for optimizing the coating properties. Coated samples were optimally annealed for 4.5 minutes in a furnace pre-heated to 850° F. (454° C.) and subjected to various tests to determine the chemical durability of the annealed coating. The accelerated tests included immersion of the samples in acidic, basic, and salt solutions, exposure to high humidity and temperature (Cleveland Condensation Chamber) and the shear resistance test described previously. The annealed coating of the present invention passed all of these tests, while a nonannealed coating with the same eight layer configuration failed in the sodium chloride immersion, Cleveland humidity and wet shear tests.

The above examples are offered to illustrate the present invention. The time and temperature of the annealing step may be varied over a wide range depending on the coating configuration, composition and thickness of the layers, and particularly type and condition of furnace or lehr. The scope of the present invention is defined by the following claims.

What is claimed is:

1. A method of increasing the shear resistance of a sputter coating deposited on a soda-lime-silica glass substrate, the glass substrate having a strain point comprising the steps of:

sputter coating onto the glass substrate successive layers of an antireflective metal oxide, an infrared reflective metal, a metal primer, an antireflective metal oxide, an infrared reflective metal, a metal primer, an antireflective metal oxide and a protective overcoat, and heating the coated glass substrate to a temperature not exceeding the strain point of the glass substrate and between about 600 and 1000° F. (about 315 to 538° C.) for a time period within the range of 1 to 8 minutes to increase the shear resistance of the coating.

2. The method according to claim 1 wherein the temperature is between about 700 and 850° F. (about 371 and 454° C.).

3. The method according to claim 1 wherein one of the layers of the antireflective metal oxide include a layer of a zinc/tin oxide and one of the layers of the infrared reflective metal is silver.

4. The method according to claim 1 wherein one of the layers of the metal primer is titanium.

5. The method according to claim 1 wherein the temperature is between about 800 to 900° F. (about 427 to 482° C.).

6. The method according to claim 5 wherein the temperature is about 850° F. (about 454° C.) and the time period is within the range of about 2 to 6 minutes.

7. The method according to claim 1 wherein the coated substrate is heated to a temperature of about 1000° F. (about 538° C.) and the time period is within the range of about one to two minutes.

8. The method according to claim 5, wherein each of the antireflective metal oxide layers comprises a mixture of zinc and tin, each of the infrared reflective metal layers is silver and each of the metal primer layers is titanium.

9. A method of increasing the shear resistance of a sputter coating deposited on a soda-lime-silica glass substrate, the glass substrate having a strain point comprising the steps of:

sputter coating onto the glass substrate successive layers of an antireflective metal oxide, an infrared reflective metal and a metal primer to provide a coated article defined as coated glass;

heating the coated glass to a temperature not exceeding the strain point of the substrate and between about 600 and 1000° F. (about 315 to 538° C.) for a time period in the range of about 1 to 8 minutes to increase the shear resistance of the coating on the coated glass, and sputter coating over the metal primer of the coated glass successive layers of an antireflective metal oxide, an infrared reflective metal, a metal primer, an antireflective metal oxide and a protective overcoat.

10. The method according to claim 9 wherein the temperature is between about 700 and 850° F. (about 371 and 454° C.).

11. The method according to claim 9 wherein one of the layers of the antireflective metal oxide include a layer of zinc/tin oxide and one of the layers of the infrared reflective metal is silver.

12. The method according to claim 9 wherein one of the layers of the metal primer is titanium.

13. The method according to claim 9 wherein the temperature is between about 800 to 900° F. (about 427 to 482° C.).

14. The method according to claim 13 wherein the temperature is about 850° F. (about 454° C.) and the time period is within the range of about 2 to 6 minutes.

15. The method according to claim 9 wherein the coated glass is heated to a temperature of about 1000° F. (about 538° C.) and the time period is within the range of about one to two minutes.

16. The method according to claim 15, wherein each of the antireflective metal oxide layers comprises a mixture of zinc and tin, each of the infrared reflective metal layers is silver and each of the metal primer layers is titanium.

* * * * *